United States Patent [19]

Garth

[11] Patent Number: 4,823,005
[45] Date of Patent: Apr. 18, 1989

[54] ELECTRON BEAM APPARATUS

[75] Inventor: Simon Garth, Cambridge, England

[73] Assignee: Texas Instruments Incorporated, Dallas, Tex.

[21] Appl. No.: 16,312

[22] Filed: Feb. 19, 1987

[30] Foreign Application Priority Data

Feb. 20, 1986 [GB] United Kingdom ............... 8604181

[51] Int. Cl.⁴ .............................................. G01N 23/00
[52] U.S. Cl. ................................. 250/310; 250/396 R; 250/397
[58] Field of Search ........... 250/310, 397, 398, 396 R, 250/305, 396 ML, 399

[56] References Cited

U.S. PATENT DOCUMENTS

| | | | |
|---|---|---|---|
| 3,474,245 | 10/1969 | Kimura et al. | 250/397 |
| 3,717,761 | 2/1973 | Koike et al. | 250/310 |
| 4,011,450 | 3/1977 | Tagawa et al. | 250/310 |
| 4,442,355 | 4/1984 | Tamura et al. | 250/310 |
| 4,658,137 | 4/1987 | Garth et al. | 250/310 |
| 4,714,833 | 12/1987 | Rose et al. | 250/310 |

FOREIGN PATENT DOCUMENTS 0179375 10/1983 Japan .
0047358 3/1985 Japan .
0131353 6/1986 Japan .

Primary Examiner—Bruce C. Anderson
Assistant Examiner—Michael Aronoff
Attorney, Agent, or Firm—N. Rhys Merrett; Gary C. Honeycutt; Melvin Sharp

[57] ABSTRACT

An electron beam apparatus in which the electron beam is directed to a sample and secondary electrons from the sample return in the direction of the beam and are deflected sideways to a collector by a first electrostatic deflection means. To compensate for distortion of the spot produced by the beam as a result of the first electrostatic deflection means, a similar deflection means is placed above the first means to correct the distortion and is so biased as to reflect secondary electrons which might otherwise pass the first means. The deflection means are 4-pole electrostatic stigmators. A threshold grid is biased to allow to pass to the first means only those secondary electrons having release speeds from the sample above a certain value.

19 Claims, 1 Drawing Sheet

ELECTRON BEAM APPARATUS

This invention relates to electron beam apparatus and in particular to such apparatus where secondary electrons from a sample being bombarded by a focussed electron beam are collected for the purpose of studying the properties of the sample giving rise to the production of those electrons.

The collection of electrons from a sample is often performed by drawing those electrons away from the sample in the general direction of the incident electron beam and then by means of suitably placed electrodes deflecting the electrons away from the beam towards some kind of collector, such as, for example, a scintillator and photomultiplier. The electrostatic field causing the relatively slow moving electrons from the sample under examination to be deflected towards the scintillator has a greatly reduced effect on the incident electron beam because its constituent electrons are travelling at a much higher speed due to the high voltages used to generate the beam and usually the effects on the beam are ignored. However, amongst the effects of this deflection field on the incident beam is a slight astigmatism which results in what should be a circular spot becoming elongated. This elongation of the spot arises apparently from the effect of the boundary surface of the electrostatic deflection field used for deflecting the electrons from the sample, which acts as a slightly "cylindrical" lens. Another cause for the distortion of the spot is the spread of speeds of the electrons constituting the incident beam which has the result, analogous to chromatic aberration, that different electrons are deflected by the same field to a different extent depending on their speeds.

It is an object of the present invention to provide improved electron beam apparatus in which the disadvantage described above is reduced.

According to the present invention there is provided electron beam apparatus in which the electron beam is directed to a sample and secondary electrons from the sample are returned in the direction of the beam and then deflected away from the beam by first electrostatic deflection means to an electron collector, wherein further electrostatic deflection means effective on the beam are located upstream of the first deflection means and the further electrostatic deflection means are so energised as to counteract the effect on the beam of the first deflection means.

Each of the first and further electrostatic deflection means may be a 4-element electrostatic stigmator in which one of the elements of the first means is a laterally extending tube with an electrically conducting grid over its inner end nearer the electron beam, and the voltages applied to the elements of the first means are such that the secondary electrons are deflected through the grid into the tube. A scintillator held at a high positive potential, say, 10kv, may be located at the outer end of the tube to receive the electrons and a photomultiplier may be placed to receive the light flashes from the scintillator. The voltages on the first deflection means should be more positive than the most positive voltage of the sample, so that the electrons from the sample are drawn towards the deflection means and can subsequently be directed to the collector. The further deflection means should have voltages which are sufficiently negative to reflect the electrons from the sample which might otherwise tend to pass the first deflection means.

The further deflection means may produce a deflecting electrostatic field which has the opposite effect on the electron beam from that of the first deflection means. In practice, the voltages on the further deflection means needed to produce the compensating deflection of the beam can be chosen to be the correct voltages for reflecting the electrons from the sample back to the collector.

In order that the invention may be fully understood and readily carried into effect it will now be described with reference to the accompanying drawings, of which:

Figure 1:
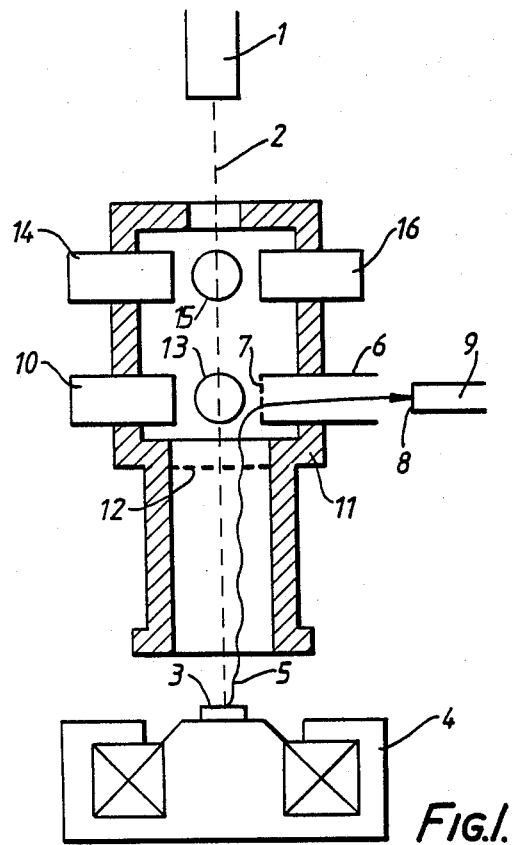
FIG. 1 is a diagram of one example of the electron beam apparatus according to the invention.

The apparatus shown in FIG. 1 has an electron gun 1 which produces a beam 2 of electrons focussed on a sample 3 placed on a single-pole magnetic lens 4. Secondary and/or backscattered electrons come from the sample 3 as a result of the bombardment by the incident electron beam 2 and a hypothetical path of one of these electrons is indicated by the line 5.

An electron collector is provided and includes an electrically conducting tube 6 directed radially relative to the construction of the apparatus which has a central axis close to which the electron beam 2 runs. The inner end of the tube 6 has an electrically conductive mesh 7 through which the electrons from the sample 3 are drawn, which then pass down the tube 6 towards a scintillator 8 maintained at a high positive potential such as, for example, 10 kv. A photomultiplier 9 produces amplified signals from the light flashes from the scintillator 8 resulting from the impact of the electrons thereon. An electrode 10 also of cylindrical form is placed opposite the electron collector and is maintained at a positive potential slightly below that of the collector itself, so that the electrons are deflected into the collector. Both the collector and the electrode 10 should be maintained at potentials which are positive with respect to the most positive voltage on the part of the sample 3 under examination so that the electrons from the sample 3 are drawn towards the collector.

The electron collector and the electrode 10 are supported in a structure 11 so as to be insulated from it and from each other, the structure 11 being arranged to contain an upwardly directed magnetic field which is at its most powerful at the sample 3 and weakens progressively with distance from the sample 3, so that electrons from the sample 3 are contained by this field and move upwardly in helical paths of increasing pitch. A grid 12 located just below the electron collector and the electrode 10 may be provided to give a threshold, adjustable by the voltage applied to it, for the energy of the electrons from the sample 3 which pass the grid and are detected by the collector.

Although it is not shown in FIG. 1, an extractor grid maintained at a very high positive potential of 1000 volts, say, may be located at the lower end of the structure 11 to accelerate electrons leaving the sample 3 into the structure 11. A further grid or other means for producing an electrostatic field may also be provided for slowing down the accelerated electrons so that they approach the grid 12 at speeds substantially equal to those at which they left the sample 3.

As thus far described, the apparatus of FIG. 1 is similar to that already proposed in U.S. Pat. No. 4,658,137 (Simon C.J. Garth et al which is assigned to Texas Instruments Incorporated and incorporated herein by reference for electron beam apparatus used to examine the potentials of an integrated circuit when in operation and may incorporate details disclosed in that application.

The electron collector and the electrode 10 may be two elements of a 4-element electrostatic stigmator of which one of the other two electrodes is indicated at 13. Above the electron collector and the electrode 10, upstream relative to the direction of the electron beam 2, there is placed a second electrostatic stigmator consisting of four elements of which the elements 14, 15 and 16 are shown. The elements of the second stigmator are maintained at potentials which are sufficiently negative to reflect any electrons from the sample 3 back towards the collector taking into consideration their starting potentials and the energy they acquire accelerating to the first stigmator. In addition, the electrodes 14 and 16 are so biassed that they deflect the electron beam 2 in the opposite direction to the deflection produced by the electron collector and the electrode 10. The voltages on the other electrodes of the two stigmators are selected to reduce as far as possible the astigmatism of the spot produced by the electron beam resulting from the electrostatic field used to collect the electrons from the sample 3.

In a typical example, the electron collector, that is to say the tube 6 and the mesh 7, are maintained at +50 volts and the electrode 10 at +40 volts. If the voltage of the sample 3 were, say, 10 volts, this would mean that the potentials of the electrodes 16 and 14 respectively of the second stigmator should be −30 volts and −20 volts to ensure reflection of the electrons from the sample 3. The energy of the electron beam 2 itself may be, for example, 1–5 kv so that the deflection effects of the stigmators will be very much less on the electron beam than on the electrons from the sample 3 which will have an energy corresponding to 40 volts, that is to say some 25–125 times smaller. This will be the case for any electron beam system in which the energy of the electron beam is significantly greater than the energy of the secondary electrons.

Figure 2:
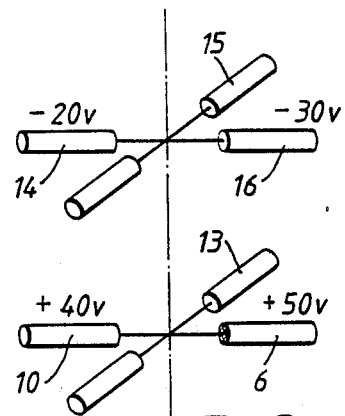
FIG. 2 is a perspective diagram of the first and further deflection means of the apparatus of FIG. 1.

FIG. 2 is a perspective diagram of the electrodes of the two stigmators shown in the apparatus of FIG. 1 which will enable the construction of the apparatus to be more clearly envisaged.

Figure 3:
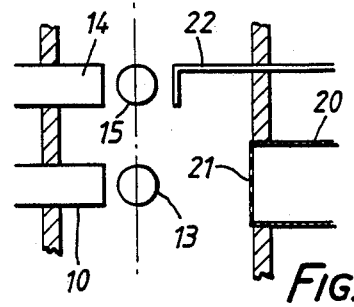
FIG. 3 shows a modification of the apparatus of FIG. 1.

FIG. 3 shows a modification to the construction of the two stigmators to improve the collection of electrons by the electron collector. In this example, the electron collector consists of a tube 20 of larger diameter than the other electrodes of the stigmators with a mesh 21 across its inner end. In addition, the tube 20 has its inner end disposed further from the axis of the apparatus to provide a larger volume for the deflection of the electrons from the sample 3 to be displaced from the axis of the apparatus towards the collector by the electrostatic field. In order to maintain the same electrostatic field on the axis the voltage on the tube 20 and mesh 21 should be raised and may be, for example, 100 volts instead of 50 volts as in the example described above. Moreover, the electrode 16 is replaced by an L-shaped electrode 22 which is cut away at its underside to provide even more space for the deflection of electrons towards the collector. The tube 20, because of its larger diameter, may provide sufficient electrostatic attraction to collect the electrons without the need for the mesh.

Although the invention has been described with reference to just two possible constructions for the apparatus, other constructions for achieving the same result will be apparent to those skilled in the art. For example, instead of using a single pole magnetic lens with the sample standing on the pole piece as shown in FIG. 1, other arrangements, magnetic and/or electrostatic, may be used to control the paths of the electrons emitted from the sample, and where such alternative arrangements are employed the planar threshold grid 12, which sets the minimum energy for electrons to be passed to the collector, may need to be replaced by a differently shaped grid. A buffer grid, not shown in the drawings, may be provided above the threshold grid 12, and maintained at a potential that is more positive than any part of the sample 3, for the purpose of ensuring that any electrons from the sample passing the threshold grid enter the control region of the lower stigmator at a reasonable speed and do not drift slowly into it to be collected by one of the three electrodes other than the collector 6.

What we claim is:

1. Electron beam apparatus having an axis along the direction of which the electron beam is directed to a sample and secondary electrons from the sample are returned in the direction of the beam, comprising a first electrostatic deflector around said axis and energizable to deflect the secondary electrons away from said beam direction to an electron collector, said energization resulting in distortion of the electron beam, and a further electrostatic deflector around said axis and energizable to counteract the distortion of the electron beam produced by said first electrostatic deflector.

2. Apparatus according to claim 1 in which the further electrostatic deflector is maintained at potentials such that secondary electrons from the sample which might otherwise pass the first electrostatic deflector and the electron collector are reflected to said first electrostatic deflector and said electron collector.

3. Apparatus according to claim 1, wherein said first deflector is energized to a potential more positive than the sample and the further deflector is energized to a negative potential.

4. Electron beam apparatus in which the electron beam is directed through first and second electrostatic deflectors to a sample mounted by a support, secondary electrons from the sample returning in the direction of the beam towards a collector for secondary electrons, a first 4-element electrostatic stigmator comprising said first electrostatic deflector together with said electron collector and a second 4-element electrostatic stigmator comprising said second electrostatic deflector, each of the first and second stigmators centered on a central axis of said apparatus close to the line of the electron beam, at least three of the elements of each stigmator comprising cylindrical electrodes extending radially from the central axis in a plane perpendicular to the central axis, the four elements of each stigmator spaced at intervals around the central axis, corresponding elements of the first and second stigmators being parallel, said electron collector forming the fourth element of the first stigmator and comprising a conductive tube open at its radially inner end.

5. Apparatus according to claim 4, wherein each of said intervals is 90°.

6. Apparatus according to claim 5 wherein the electrodes of the stigmators are all of substantially the same size.

7. Apparatus according to claim 5 wherein in each of the first and second stigmators said three cylindrical electrodes are of substantially the same size; the electron collector tube is of larger diameter than and is spaced further from the central axis than said three cylindrical electrodes of the first stigmator; and the fourth element of the second stigmator is adjacent to the electron collector tube and is cut away on a side nearest the electron collector.

8. Apparatus according to claim 4 including a potential source connected for energization of said first electrostatic deflector to deflect the secondary electrons away from said electron beam to said electron collector, said energization causing distortion of the electron beam, and a potential source connected for energization of the second electrostatic deflector to counteract the distortion of the electron beam resulting from said energization of the first deflector and to reflect to the first electrostatic deflector for defelction to said electron collector, secondary electrons that would otherwise pass the first electrostatic deflector.

9. Apparatus according to claim 4, in which the electron collector tube has a conductive mesh across its inner end.

10. Apparatus according to claim 4 wherein the electron collector further includes a scintillator located at the outer end of the tube and maintained at a high positive potential, and a photomultiplier located to receive light flashes from the scintillator.

11. Apparatus according to claim 3 including a threshold grid located between the sample support and the first electrostatic deflector, at such a position that the secondary electrons from the sample approach the threshold grid at speeds bearing a predetermined relationship to the speeds at which they left the sample, a source for biasing the threshold grid at a potential to allow to pass only secondary electrons having speeds greater than a desired value.

12. Apparatus according to claim 11 including a buffer grid between the threshold grid and the first electrostatic deflector, and a source for biasing the buffer grid at a potential more positive than any potential on the sample so as to accelerate secondary electrons from the sample passing the threshold grid.

13. Apparatus according to claim 11 wherein the sample support comprises the pole of a single magnetic lens and means are provided to constrain the magnetic field to weaken gradually between the sample support and the threshold grid so that secondary electrons from the sample follow helical paths of progressively longer pitches towards the threshold grid, so that they approach the threshold grid substantially normally.

14. Apparatus according to claim 11 including an extractor grid maintained at a high positive potential near the sample to accelerate rapidly secondary electrons from the sample, and other electrostatic means is provided to retard the secondary electrons from the sample to the speeds at which they approach the threshold grid.

15. Apparatus according to claim 11, wherein the cylindrical electrodes of each stigmator are spaced at 90° intervals around said central axis.

16. Electron beam apparatus in which the electron beam is directed to a sample serially through first and second electrostatic deflectors, and secondary electrons from the sample are returned in the direction of the beam, a potential source connected for energizing said first electrostatic deflector to deflect the secondary electrons away from said electron beam to an electron collector, said energization causing distortion of the electron beam, and a potential source connected for energizing the second electrostatic deflector to counteract the distortion of the electron beam resulting from energization of the first deflector.

17. Apparatus according to claim 16 in which said energization of the second electrostatic deflector is also effective to cause the second electrostatic deflector to reflect to the first electrostatic deflector for deflection to the electron collector, secondary electrons that would otherwise pass the first electrostatic deflector.

18. A method of correcting distortion of an electron beam directed to a sample to produce secondary electrons which are returned in the direction of the beam and deflected away from the beam by a first electrosatic deflection field toward an electron collector, said first electrostatic deflection field surrounding and causing distortion of the electron beam, in which before being subjected to the first electrostatic deflection field, the electron beam is also subjected to a second electrostatic field surrounding the electron beam to compensate for the distortion produced by the first electrostatic field.

19. A method according to claim 18, wherein the second electrostatic field also reflects secondary electrons that have been subjected to the first electrostatic field but not collected, back to the first electrostatic field for deflection toward the electron collector.

* * * * *